US011867770B2

(12) United States Patent
Wolfe et al.

(10) Patent No.: US 11,867,770 B2
(45) Date of Patent: Jan. 9, 2024

(54) REMAINING-LIFE AND TIME-TO-FAILURE PREDICTIONS OF POWER ASSETS

(71) Applicant: Fischer Block, Inc., West Chester, PA (US)

(72) Inventors: Gregory Wolfe, Royersford, PA (US); Margaret Paietta, Royersford, PA (US)

(73) Assignee: Fischer Block, Inc., West Chester, PA (US)

( * ) Notice: Subject to any disclaimer, the term of this patent is extended or adjusted under 35 U.S.C. 154(b) by 0 days.

(21) Appl. No.: 17/665,154

(22) Filed: Feb. 4, 2022

(65) Prior Publication Data

US 2022/0334193 A1    Oct. 20, 2022

Related U.S. Application Data

(63) Continuation of application No. 15/735,463, filed as application No. PCT/US2016/035488 on Jun. 2, 2016, now Pat. No. 11,243,263.
(Continued)

(51) Int. Cl.
*G01R 31/40* (2020.01)
*G06Q 10/20* (2023.01)
(Continued)

(52) U.S. Cl.
CPC ......... *G01R 31/40* (2013.01); *G05B 23/0283* (2013.01); *G06Q 10/06* (2013.01);
(Continued)

(58) Field of Classification Search
CPC .... G01R 31/40; G05B 23/0283; G06Q 10/06; G06Q 10/20; G06F 16/90; G06N 7/005; G06N 20/00
See application file for complete search history.

(56) References Cited

U.S. PATENT DOCUMENTS 8,347,957 B2   1/2013   Stephenson et al.
8,599,008 B2   12/2013  Watson et al.
(Continued)

FOREIGN PATENT DOCUMENTS

CN     1862278 B    9/2011

OTHER PUBLICATIONS

First Examination Report for corresponding Indian Application No. 201817000155 dated Feb. 23, 2021, 7 pages.
(Continued)

*Primary Examiner* — Roy Y Yi
*Assistant Examiner* — Geoffrey T Evans
(74) *Attorney, Agent, or Firm* — Morgan, Lewis & Bockius LLP (57) ABSTRACT

A method for predicting time-to-failure and remaining-life of an electrical power system asset includes analyzing characteristics of the power system asset over a specified time interval; based on the analysis, associating the power system asset with a pool of similar power system assets having similar historical performance characteristics; and based on the association, calculating time-to-failure and remaining-life probability factors for the power system asset. A computer program product is also provided for carrying out the method, and the method may further include a mechanism whereby the computer program learns ways to modify and enhance the analysis of the performance characteristics to provide for higher confidence levels in time-to-failure and remaining-life probability calculations.

20 Claims, 8 Drawing Sheets

Related U.S. Application Data (60) Provisional application No. 62/171,015, filed on Jun. 4, 2015.

(51) Int. Cl.
  *G06Q 10/06* (2023.01)
  *G05B 23/02* (2006.01)
  G06N 20/00 (2019.01)
  G06F 16/90 (2019.01)
  G06N 7/01 (2023.01)

(52) U.S. Cl.
  CPC ............... *G06F 16/90* (2019.01); *G06N 7/01* (2023.01); *G06N 20/00* (2019.01); *G06Q 10/20* (2013.01)

(56) References Cited

U.S. PATENT DOCUMENTS

| 8,750,488 | B2 | 6/2014 | Spottiswoode et al. |
| 8,887,008 | B2 | 11/2014 | Hosking et al. |
| 8,943,308 | B2 | 1/2015 | Bandini et al. |
| 8,972,067 | B2 | 3/2015 | Holt et al. |
| 2009/0096405 | A1 | 4/2009 | Flickinger et al. |
| 2013/0191185 | A1 | 7/2013 | Galvin |
| 2013/0317732 | A1 | 11/2013 | Borg et al. |
| 2014/0350989 | A1 | 11/2014 | Telatar et al. |
| 2017/0178015 | A1* | 6/2017 | Sato .................. G06N 7/01 |

OTHER PUBLICATIONS

International Patent Application No. PCT/US2016/035488, International Search Report and Written Opinion, dated Sep. 1, 2016, 8 pages.

International Patent Application No. PCT/US2016/035488, International Preliminary Report on Patentability, dated Dec. 5, 2017, 7 pages.

* cited by examiner

REMAINING-LIFE AND TIME-TO-FAILURE PREDICTIONS OF POWER ASSETS

CROSS-REFERENCE TO RELATED APPLICATIONS

This application is a continuation of U.S. patent application Ser. No. 15/735,463 filed Dec. 11, 2017, which is a U.S. National Phase Application under 35 U.S.C. 371 of International Application No. PCT/US2016/035488 filed Jun. 2, 2016, which claims the benefit of U.S. Provisional Patent Application No. 62/171,015, filed on Jun. 4, 2015 and entitled "Remaining-Life and Time-to-Failure Predictions of Power Assets," all of which are incorporated herein by reference in their entireties.

BACKGROUND

Generally, electrical power originates at a generation station and is transmitted to a load by a system of conductors and other equipment that make up an electrical power system. The pieces of equipment, or assets, that make up an electric power system can include, but are not limited to, motors, generators, switches, reclosers, insulators, capacitors, transformers, batteries, and other equipment. Through long periods of normal use, or as the result of some particular cause such as lightning or other contact of unknown origin to a conductor, the performance of power system assets can begin to exhibit signs of performance degradation and cease to operate normally or fail.

In some other cases, poor performing assets may continue to operate for long periods of time without detection, which may cause disturbances that may adversely affect the performance or cause failure of other equipment in the power system.

Electrical power system asset failures can ultimately lead to loss of electric service to end users or damage to property or personnel or even result in the loss of human life.

When an outage occurs, failing or failed equipment often must be repaired or replaced before normal, reliable service can be restored. Such repairs or replacements, undertaken by electrical power system operators, such as utility companies, often must be made at times and under conditions that cause additional difficulties and expense in manpower and equipment. Repairs made in this manner are often more troublesome and expensive than if they could have been planned in advance. In addition, if repairs can be made before a power outage occurs, overall service is more reliable and of a higher quality, and inconveniences, economic losses, and other hazards to end users may be minimized or avoided. Therefore, it is desirable to know when such failure or improper or sub-optimal performance of a power system asset is most likely to occur before any such conditions affect power quality or cause momentary interruptions or sustained power outages.

Utilities may utilize conventional methods to reduce the number of power interruptions and outages that occur. Conventional methods may include a) physically examining and/or testing individual assets periodically in an effort to determine whether they are beginning to fail and may cause a power outage or power quality problems and/or b) replacing assets according to a predetermined schedule. Inherent problems exist with both of these approaches. One significant problem is that examining, testing, and/or replacing large numbers of individual devices can be time-consuming, expensive, and difficult to schedule without interrupting power to end users. A problem with the second approach is that, when assets are replaced according to a predetermined schedule, they may be replaced when they are functioning normally, well before any failure would have actually occurred. Alternatively, assets may fail before they are scheduled to be replaced, thereby causing loss of service to end users. Further, periodic or regularly scheduled maintenance or replacement of assets can inadvertently introduce performance problems that did not previously exist. Clearly, it would be preferable to know when assets are most likely to fail, so that repairs or replacements can be scheduled and undertaken just prior to any such failures, safely, efficiently, economically, and without loss of service to end users.

SUMMARY

These and other shortcomings of the prior art are addressed by embodiments disclosed herein, which according to one aspect provides a method for predicting time-to-failure and remaining-life of an electrical power system asset by analyzing characteristics of a given power system asset (including but not limited to performance, environmental, and usage related) over a specified time interval and, based on the analysis, associating the given power system asset with a pool of similar power system assets having similar historical performance characteristics (generally but not necessarily over a longer time period than that of the given asset); and based on the association, calculating time-to-failure and remaining-life probability factors for the given power system asset. These time-to-failure and remaining-life probability factors can then be input into a utility company's operational plan in order to improve the safety, efficiency, and effectiveness of planning, preparing, and executing asset repairs and replacement activities.

According to another embodiment, a computer program product includes one or more computer readable media having stored thereon a plurality of instructions that, when executed by one or more processors of a system, causes the one or more processors to: (a) analyze characteristics of an asset of interest in an electrical power system, (b) based on the analysis, associate the power system asset with a pool of similar assets listed in a database, each of which have similar historical performance characteristics to the asset of interest; and (c) based on the association, calculate time-to-failure and remaining-life probability factors.

According to another embodiment, a computer program product carries out the method in such a way that the computer program learns ways to modify and enhance the analysis of the asset characteristics to increase the confidence levels in the calculated time-to-failure and remaining-life probability factors.

In an embodiment, a power system asset health assessment system comprises: a plurality of monitoring systems connected via a common network, each monitoring system configured to monitor a respective asset of a plurality of assets in an electrical power system; a computing device in communication with the plurality of monitoring systems via the common network, the computing device configured to: acquire data representing operating characteristics of a given asset over a data collection interval from a respective one of the plurality of monitoring systems; associate the given asset with a plurality of similar assets having data stored within a database accessible by the computing device, the plurality of similar assets containing similar historical operating characteristics to the operating characteristics of the given asset; correlate the similar historical operating characteristics of the plurality of similar assets within the database with repair and replacement activity for the plurality of similar assets;

and based on the correlation, predict one or more of a most likely time-to-failure of the given asset and a most likely remaining-life of the given asset.

According to an embodiment, a method for performing an asset health assessment for an asset operating within an electrical power system includes: acquiring, by a computing device in communication with the electrical power system, data representing operating characteristics of the asset over a data collection interval; associating, by the computing device, the asset with a plurality of similar assets having data stored within a database accessible by the computing device, the plurality of similar assets containing similar historical operating characteristics to the operating characteristics of the asset; correlating, by the computing device, the similar historical operating characteristics of the plurality of similar assets within the database with repair and replacement activity for the plurality of similar assets; and based on the correlation, predicting, by the computing device, one or more of a most likely time-to-failure of the asset and a most likely remaining-life of the asset.

In an embodiment, the method further includes outputting, by the computing device, the predictions to a local computer associated with the asset to perform one or more corrective actions for the asset. In an embodiment, the method also includes comparing, by the local computer, the one or more of the most likely time-to-failure of the asset and the most likely remaining-life of the asset to pre-established threshold values to determine the one or more corrective actions for the asset.

According to an embodiment, the acquisition by the computing device of the data representing operating characteristics of the asset is by transmission of the data from a local computer associated with the asset, the local computer connected via a network to the computing device. In an embodiment, the local computer associated with the asset receives asset characteristic data from a monitoring device coupled to the asset; and the local computer calculates the data representing the operating characteristics of the asset based on the received asset characteristic data.

In an embodiment, the data representing operating characteristics of the asset comprises statistics relating to one or more of performance characteristics, environmental characteristics, and usage characteristics of the asset.

According to an embodiment, the method further comprises calculating, by the computing device, percentile rankings based on the operating characteristics of the asset and the similar historical operating characteristics of the asset.

In an embodiment, predicting one or more of the most likely time-to-failure of the asset and the most likely remaining-life of the asset comprises calculating a set of probabilities associated with one or more of next repair of the asset and next replacement of the asset, for various points in time, for a given operating characteristic of the operating characteristics of the asset.

According to an embodiment, the method may further comprise establishing the database by: acquiring, by the computing device, data representing at least one operating characteristic of a particular asset within the electrical power system at specific points in time; acquiring, by the computing device, data indicating when repair and replacement activity is conducted for the particular asset within the electrical power system; and populating, by the computing device, the database with time-identified operating characteristics and repair and replacement activity for the particular asset within the electrical power system.

In yet another embodiment, the method for performing an asset health assessment for an asset also includes acquiring, by the computing device, one or more flag settings relating to one or more of repair of the asset and replacement of the asset; and associating, by the computing device, the one or more flag settings with the asset in the database.

In an embodiment, the method may also include performing, by the computing device, sensitivity analysis comprising: performing a first-order sensitivity analysis for each operating characteristic of the asset based on asset risk factors and the one or more of the most likely time-to-failure of the asset and the most likely remaining-life of the asset; performing a second-order sensitivity analysis using combined effects of possible combinations of pairs of the operating characteristics of the asset; comparing results of the first-order and the second-order sensitivity analyses; and if any second-order sensitivities are greater than the first-order sensitivities, updating the database with second-order asset statistics to be associated with the asset.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

Embodiments are directed to a method for predicting time-to-failure and remaining-life of an electrical power system asset, and provide for a computer program product to carry out the method in such a way that the computer program product is able to learn and adapt, to increase the statistical confidence level of the time-to-failure and the remaining-life probability calculations.

Figure 1:
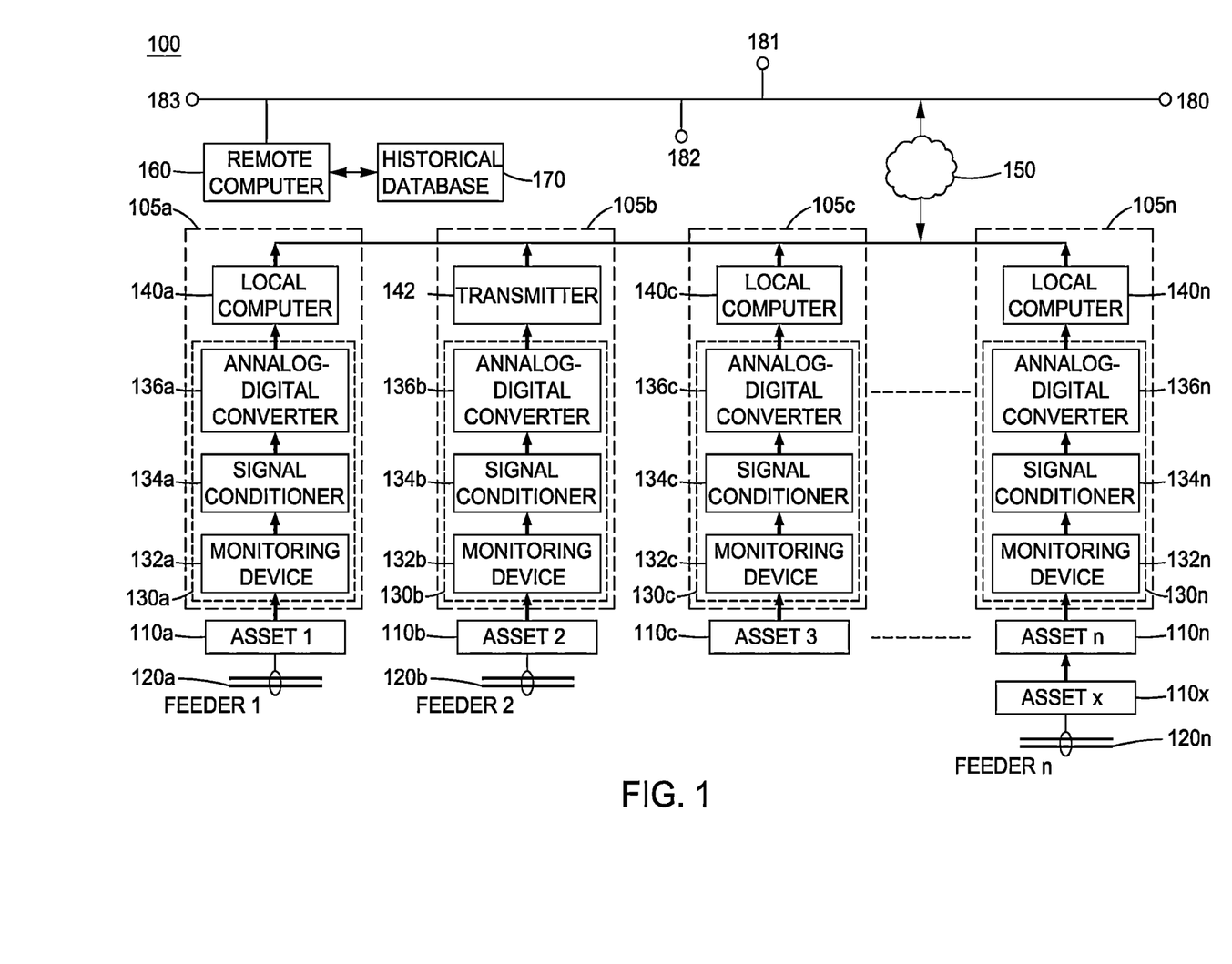
FIG. 1 is a block diagram of an exemplary power system asset health assessment system, according to an embodiment.

Referring to the drawings, an exemplary power system asset health assessment system 100, according to an embodiment, is illustrated in FIG. 1. The exemplary system 100 is comprised of multiple monitoring systems 105 connected via a common network, each monitoring system 105 configured to monitor a respective asset 110 in an electric power system. The assets that make up an electric power system can include, but are not limited to, motors, generators, switches, reclosers, insulators, capacitors, transformers, batteries, and other equipment.

Each monitoring system 105 is, according to an embodiment, comprised of a data acquisition unit 130 and a local computer 140 or transmitter 142. As shown in FIG. 1, the exemplary system 100 is comprised of four monitoring systems 105a, 105b, 105c, and 105n, for respectively monitoring asset 110a, 110b, 110c and 110n/110x, although fewer or additional monitoring systems 105 and assets 110 may be incorporated.

Each data acquisition unit 130 (and monitoring system 105) is coupled to an asset 110, each of which may further be coupled to a plurality of feeder lines 120 of an electrical power system. The feeder lines each receive power from one or more generating stations or power sources (not shown), and each feeder line delivers power from the power source (not shown) to a variety of end user customers (not shown). In an embodiment, as shown in FIG. 1, an asset 110c, such as for example a battery, need not be coupled to a feeder line. In an additional embodiment, also as shown in FIG. 1, an asset 110n may be coupled to another asset 110x, which is in turn coupled to a feeder line 120n. This provides for the monitoring system 105n of the system 100 to monitor one or both of the assets 110n and 110x. This arrangement can be expanded to include additional assets 110.

As mentioned, and as shown in the illustrated example, the power system asset health assessment system 100 includes one or more monitoring units 105 and data acquisition units 130. However, in some embodiments, the power system asset health assessment system 100 need not include the monitoring units 105 and the data acquisition units 130, but may instead be implemented as software and/or hardware which analyzes data provided from an outside source, such as existing measurement equipment.

In another embodiment, the power system asset health assessment system 100 may include one or more monitoring units 105 and data acquisition units 130 and may additionally analyze data provided from an outside source.

According to an embodiment, the system may be used at any location within an electrical power system, e.g., generating stations, substations, transmission lines, primary and secondary distribution lines, and customer facilities.

In an embodiment, as shown in FIG. 1, the data acquisition units 130 include a monitoring device 132, such as a sensor or transducer, coupled to the asset 110. The term "monitoring device" is broadly defined herein to include sensing devices, detecting devices, and any other structurally equivalent device or system understood to be interchangeable therewith by those skilled in the art. The illustrated monitoring device 132 senses or monitors asset characteristics, which may include voltage, current, power, harmonics, temperature, vibration, amp-hours, switching speed, and the like. Embodiments may be implemented with assets operating within either a single-phase or 3-phase system. Moreover, the data acquisition units 130 may receive transducer signals from already existing sensors.

For each data acquisition unit 130, one or more asset characteristic signals are sensed by a transducer (i.e., monitoring device 132), optionally conditioned by a signal conditioning circuit 134, digitized through an analog-to-digital converter 136, and then transmitted to a computing device (local computer 140) for analysis and saving, and/or for further transmitting to a remote computing device (remote computer 160 and/or one or more access points 180, 181, 182, 183). In an embodiment, instead of a local computer 140, a transmitter 142 is part of the monitoring unit 105b. In this embodiment, the transmitter 142 sends the digitized data, over a network 150, to the remote computer 160 or to a computing device at one of the access points 180-183 for the analysis computations described herein.

The local computer 140 may be contained within the same housing as the data acquisition unit 130 or may be external to the data acquisition unit 130 (such as an external computing device commonly referred to as a PC). Throughout and/or at the end of a data collection time interval, the local computer 140 may calculate statistics associated with each asset characteristic. In one embodiment, such asset statistics may include, but are not limited to, the minimum, maximum, average, mean, standard deviation, total, or changes in each such statistic since the last data collection period.

According to an embodiment, the data collection time interval is a time frame used for calculating statistics associated with one or more asset characteristics. The data collection interval may be dependent on the asset 110 and the associated asset characteristics being monitored. In an embodiment, the data collection interval is determined by a user of the system 100 (e.g., a utility company). According to an embodiment, the data collection interval is any meaningful time period in which data representative of the asset may be collected. In an embodiment, the data collection interval is one day, one week, one month, one quarter, or one year. The data collection interval may be defined to coincide with seasons, according to an embodiment.

In one embodiment, each time the asset 110 of interest is repaired, a REPAIR FLAG within the local computer 140 is set="1" (or "TRUE") automatically or by a user of the system 100.

In one embodiment, in the event an asset 110 is taken out of service due to failure reasons, a TAKEN OUT of SERVICE (TOS) FLAG within the local computer 140 is set="1" (or "TRUE") automatically or by a user of the system 100.

In one embodiment, the computing device 140 may be local and may be further connected to a remote computing device (remote computer 160) through the network 150, e.g., a local area network (LAN), a wide area network (WAN), and/or the Internet (which may also be referred to as the cloud). At the end of the data collection interval, the time and asset statistics along with the status of the REPAIR and TOS flags are transmitted to the remote computer 160 for further analysis and for saving in a remote database (historical database 170), whereby such remote computing device 160 is connected to such a database 170 containing time-identified asset statistics and REPAIR and TOS flags for a population of same or similar devices to the asset 110 in question. Optionally, the remote database 170 may contain other data from assets 110 which are not the same or similar to the device (asset 110) in question and such other data may be excluded from analysis based on query filtering.

According to an embodiment, as used herein "same" or "similar" devices or assets refer to those assets, within a large population of assets, which: (a) meet the query parameters (see 310 of FIGS. 3 and 405 of FIG. 4) which may be defined by the user of the system, and (b) exhibit the same or similar characteristics to those characteristics of the asset being evaluated (see 230 of FIGS. 2 and 320 of FIG. 3). Typical query parameters may include the asset's date of installation (such as year installed), use application (such as battery, transformer, circuit breaker, etc.), and/or geographic region of operation (which may be indicative of general climatic conditions). An example of assets exhibiting a "same" characteristic would be those assets which each separately reach and stabilize at a given "same" temperature when being operated. An example of assets exhibiting "similar" characteristics would be those assets, while being operated, each separately reach and stabilize at temperatures which are within close proximity to each other (i.e., with a certain number of standard deviations). The specific number of standard deviations which might indicate "closeness" or "similarity" would be subject to iterative adjustment as part of the machine-learning aspect described herein (see 700 of FIG. 7).

Periodically, at regular intervals, or in real-time, the remote computing device 160, based on all or a subset of data contained in the database, performs asset health assessments, which may include calculations of asset risk factors which may be comprised of percentile factors for each asset statistic; time-to-failure probability calculations, which may include calculations predicting the amount of time which is most likely to pass before the asset being assessed will exhibit failing performance to a level requiring it, at that time, to be temporarily removed from service for repair and maintenance activities; and remaining-life probability calculations, which may include calculations predicting the amount of time which is most likely to pass before the asset being assessed will exhibit failing performance to a level beyond repair requiring it to be permanently removed from service for replacement. Other risk factors may be envisioned and calculated. It is understood that the local computing device 140, rather than the remote computing device 160, may be capable of and therefore may calculate the asset risk factors, time-to-failure, and/or remaining-life calculations, if such local computer 140 contains or has access to a database containing time-identified asset statistics and REPAIR and TOS flags for a population of same or similar devices to the asset 110 in question. According to various embodiments, each of the asset risk factors, time-to-failure, and/or remaining-life calculations need not be performed for every asset of interest. For example, in one embodiment, time-to-failure calculations may be of interest for an asset of interest, while in other embodiments, various combinations of the asset risk factors, time-to-failure, and/or remaining-life calculations are desired.

In one embodiment, the remote computing device 160 further performs sensitivity analysis to determine which asset characteristics and any such combinations thereof, have the greatest ability to impact health assessment calculations. In one embodiment, the sensitivity analysis includes sensitivity analysis of asset characteristics and second order combinations thereof; and for which the sensitivity of any time-to-failure or remaining-life calculation is shown to increase, such asset characteristic or second order combination thereof is then included in future asset health assessments; in so doing, iteratively increasing, with each subsequent use of the asset health assessment system 100, the confidence level of time-to-failure and remaining-life probability calculations. The exact type of sensitivity analysis is not critical to the present invention and more than one type of sensitivity analysis may be used. A feature of the sensitivity analysis is that it identifies any such asset characteristic or combination thereof for which the time-to-failure and/or remaining-life probability calculations increases in sensitivity.

Once the health assessments calculations are completed by the remote computing device 160, the remote computing device 160 may transmit the results to the local computing device 140 located either within or near the asset 110 of interest for comparison to predefined asset health threshold levels. Alternatively, the remote computing device 160 may perform such comparisons. In the event any threshold level is exceeded, then repair or replacement activities may accordingly be prepared, scheduled, and/or initiated. It is understood that asset health threshold levels may be based on system user's (typically a utility company's) risk tolerance for asset failure and/or based on the level of available repair and replacement resources, whereby such available resources may be constrained by one or more of qualified personnel, equipment, or monetary capital, for example.

Once the asset of interest is repaired or taken out of service, then the REPAIR or TOS flag, respectively, is set to "1" (or "TRUE"). In so doing, the next time the local computing device 140 transmits a dataset to the remote computing device 160, such REPAIR and TOS data will be included in the data packet and thus will be saved in the remote database 170.

After the local computing device 140 sends the dataset to the remote computing device 160, the REPAIR and TOS flags are reset="0" (or "FALSE").

Figure 2:
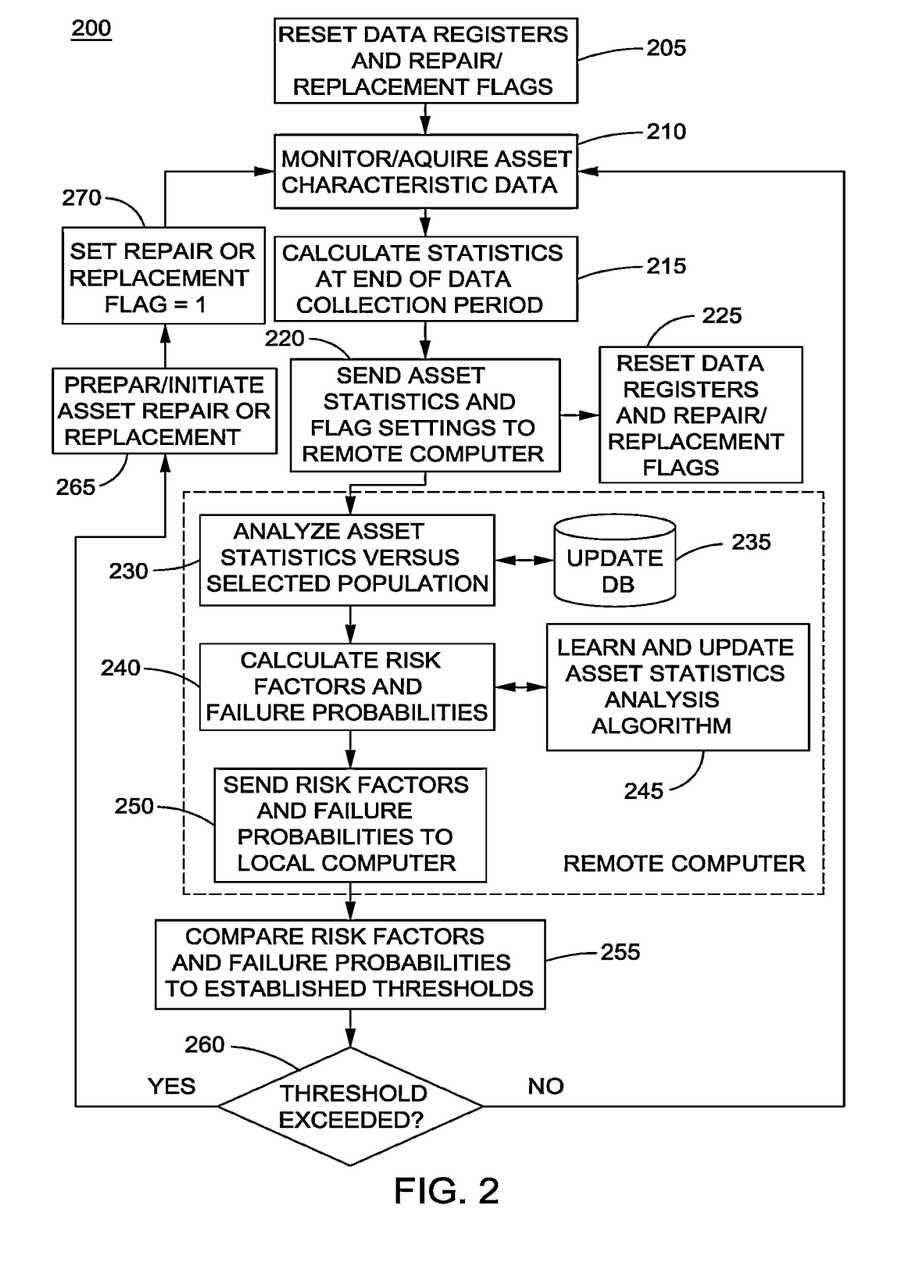
FIG. 2 is a flowchart showing steps for, according to one embodiment, monitoring, acquisition, and data analysis for predicting time-to-failure and remaining-life of a given asset within an electrical power system.

Now turning to FIG. 2, a flowchart 200 illustrates a method for monitoring, acquiring, and analyzing data for predicting time-to-failure and remaining-life of an asset 110.

At 205, data registers and REPAIR and TOS flags are reset by the local computer 140. At 210, the local computer 140 associated with the asset 110 monitors and acquires asset characteristic data. The monitoring and acquisition is, according to an embodiment, continuous.

At 215, at the end of a specified data collection interval, statistics relating to the asset characteristic data are calculated. At 220, the asset statistics and flag settings are sent over the network 150 to the remote computer 160. At 225, the local computer resets the data registers and the REPAIR and TOS flags.

The remote computer 160 performs the following operations: at 230, the asset statistics received from the local computer 140 are analyzed versus a population of asset statistics from the same or similar assets over the same data collection interval from past points in time. This historical data is obtained from the database 170. The population may be, according to an embodiment, a subset of the entire population or, in another embodiment, the entire population of the same or similar assets. At 235, the database 170 is updated with the asset statistics. At 240, based on the analysis at 230, risk factors and failure probabilities are calculated. This data is used, at 245, to learn and update the asset statistics analysis algorithm. At 250, the remote computer 160 sends the calculated risk factors and failure probabilities to the local computer 140.

At 255, the local computer compares the received, calculated risk factors and failure probabilities to established thresholds. At 260 a determination is made as to whether one or more thresholds are exceeded. If no thresholds are exceeded, the method continues to 210 for further monitoring and acquisition of asset characteristic data. If, on the other hand, thresholds are exceeded, then at 265, asset repair or replacement is initiated. At 270, the REPAIR and/or TOS flags are set to "1", and the method continues to 210 for further monitoring and acquisition of asset characteristic data.

Figure 3:
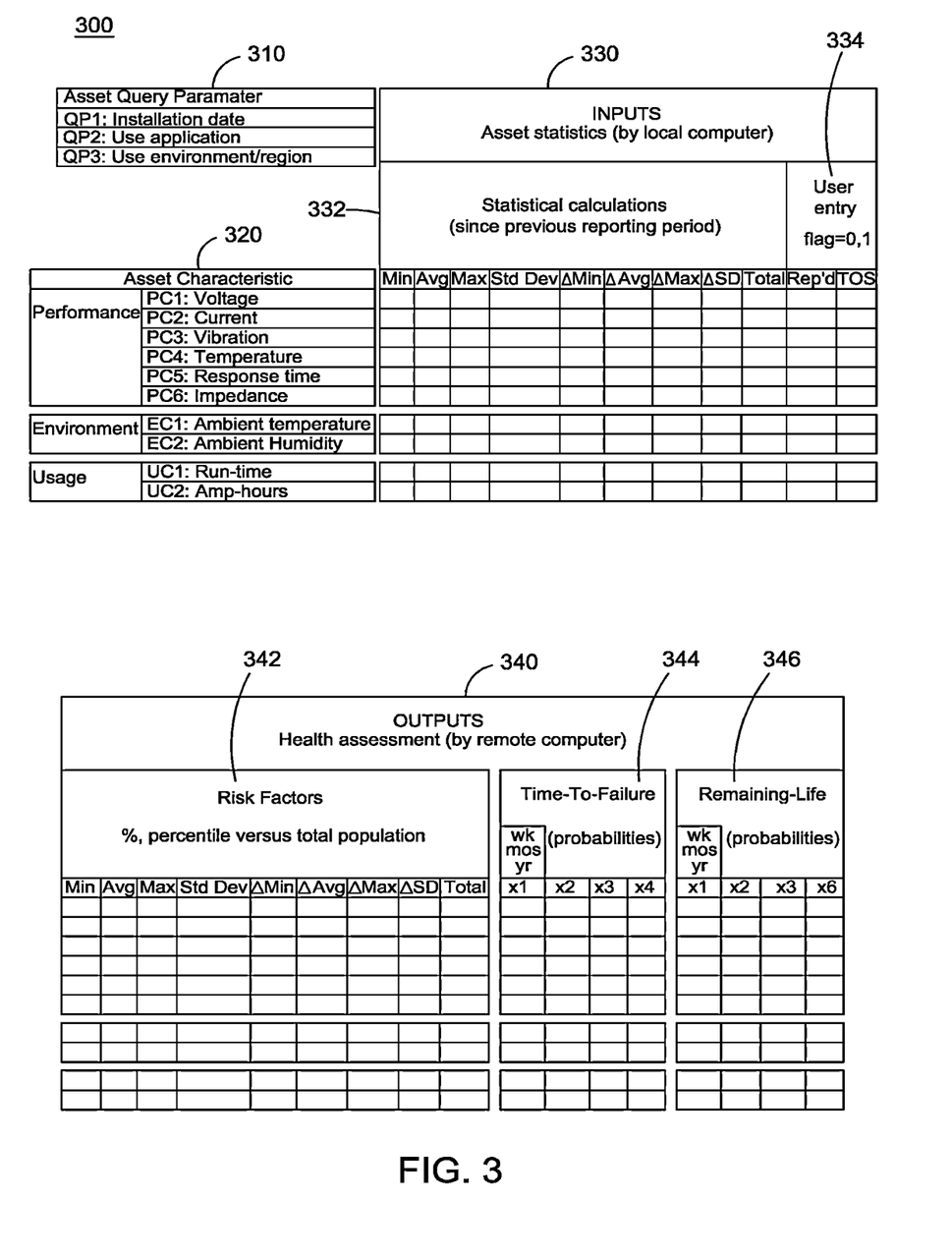
FIG. 3 is an exemplary table showing elements of exemplary data categories for a power system asset health assessment system for predicting time-to-failure and remaining-life of a given asset within an electrical power system, according to an embodiment.

FIG. 3 is an exemplary table or report 300 showing elements of exemplary data categories for a monitoring, acquisition, and data analysis system (such as the power system asset health assessment system 100 according to embodiments described herein) for predicting time-to-failure and remaining-life of a given asset 110 within an electrical power system, according to an embodiment. The table 300 includes an asset query parameter section 310 that includes such information as, for example, installation date, use application, and use environment/region. Section 320 lists examples of asset characteristics that may be monitored, including performance characteristics (e.g., voltage, current, vibration, temperature, response time, and impedance), environmental characteristics (e.g., ambient temperature and ambient humidity), and usage characteristics (e.g., run-time and amp-hours). Section 330 indicates the inputs for calculating the risk factors and failure probabilities, including the statistical calculations (section 332) and the REPAIR and TOS flags (section 334). The outputs are included in section 340 and include the calculated risk factors (section 342) and the failure probabilities (time-to-failure in section 344 and remaining-life in section 346). The table or report 300 is just one example for providing an overview of the data categories according to embodiments provided herein. Additional information related to the asset 110 and its characteristics may also be included.

Figure 4:
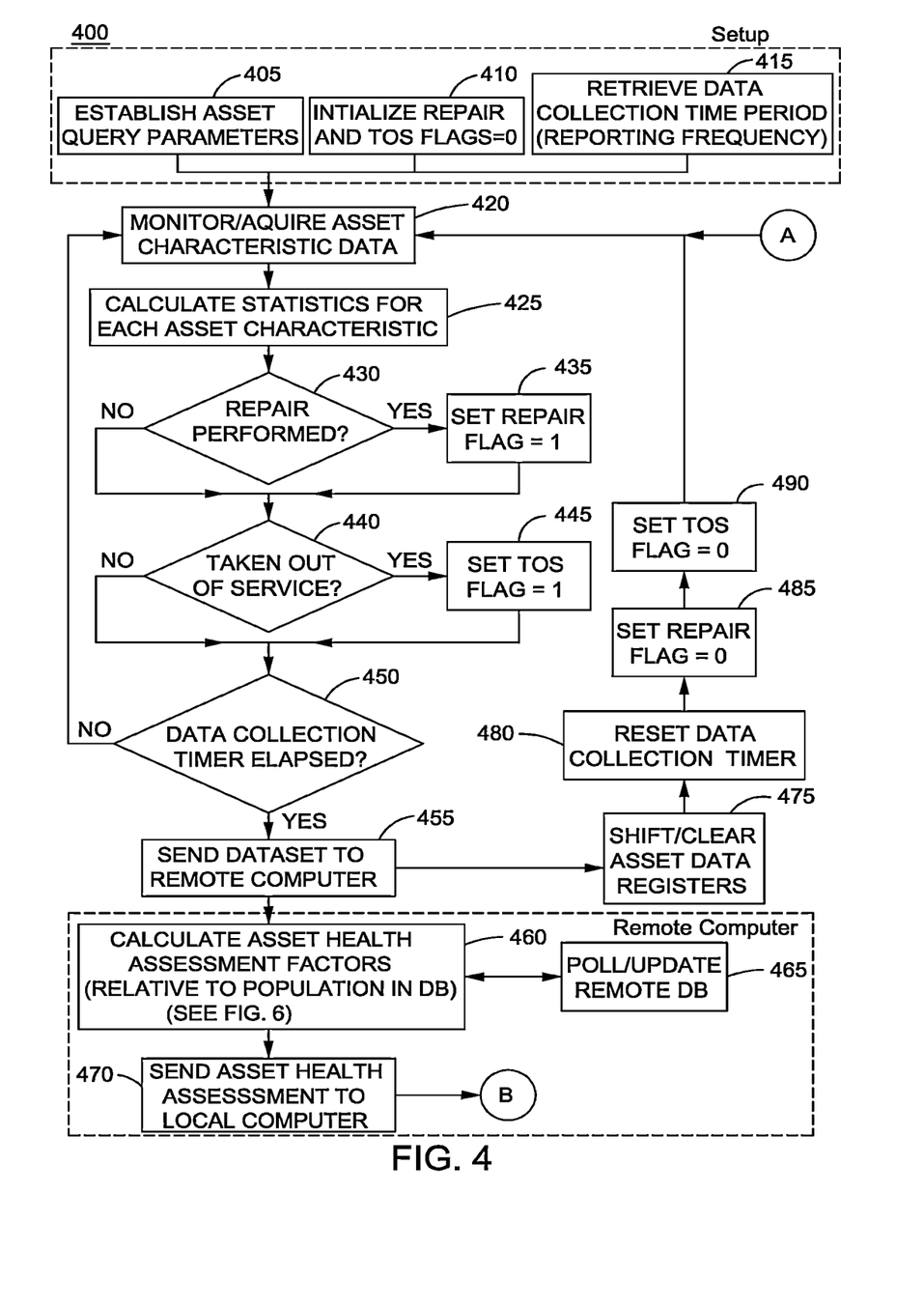
FIGS. 4 and 5 combine to show a flowchart outlining steps for a monitoring, acquisition, and data analysis for predicting time-to-failure and remaining-life of a given asset within an electrical power system, according to an embodiment.
Figure 5:
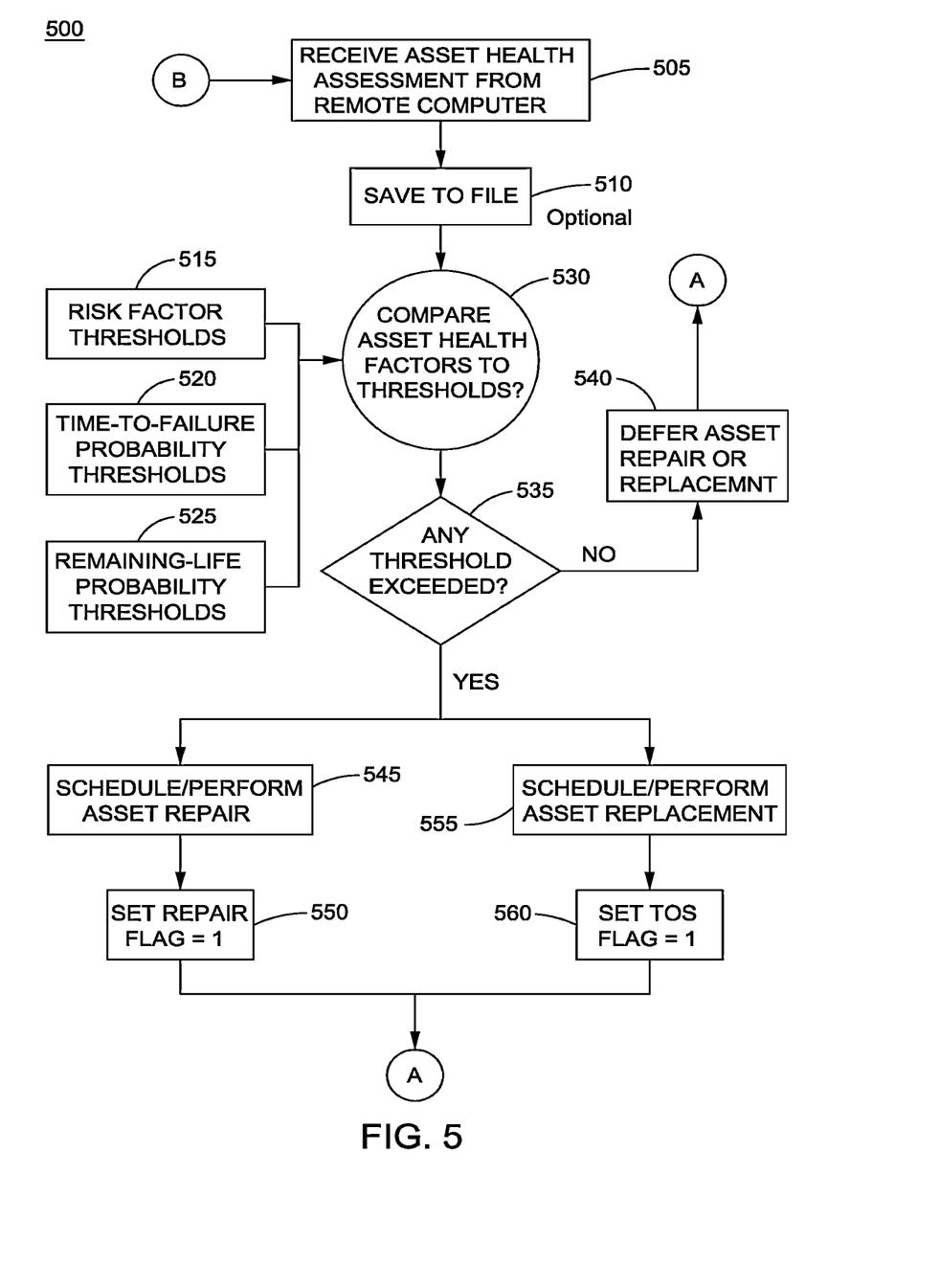

FIGS. 4 and 5 combine to show a flowchart 400, 500 outlining steps for monitoring, acquisition, and data analysis for predicting time-to-failure and remaining-life of a given asset 110 within an electrical power system, according to an embodiment.

With reference to FIG. 4, steps 405, 410, and 415 comprise setup operations and include the following user entries: establish asset query parameters (405), initialize REPAIR and TOS flags to "0" (410), and retrieve or input data collection interval (i.e., a reporting frequency) (415) for a given asset 110.

The query parameters (405) may include those shown in section 310 of FIG. 3 (i.e., installation date, use application, and use environment/region). According to an embodiment, the power system asset health assessment system 100 may monitor more than one asset type at a time, thus providing a mechanism to differentiate and/or compare the health of assets between asset types when performing health assessments. In this embodiment, an additional query parameter may include the types of assets or particular assets to be monitored, and the method for monitoring, acquiring, and analyzing data is performed for each asset or asset type. In an embodiment, the report 300 is expanded to include the various assets or asset types being monitored.

With the setup complete, at 420, asset characteristic data is monitored and acquired for the asset 110 (or assets 110). The asset characteristic data may include performance characteristics, environmental characteristics, and/or usage characteristics.

At 425, statistics for each asset characteristic of the asset 110 are calculated. Examples of the calculated statistics include but are not limited to minimum, maximum, average, mean, standard deviation, total, or changes in each such statistic since the last data collection period.

At 430, a repair performed determination is made. If a repair of the asset 110 is performed, at 435, the REPAIR flag is set to "1". If no repair is performed or when the REPAIR flag is set to "1", a taken-out-of-service determination is made at 440. If the asset 110 is taken out of service, at 445, the TOS flag is set to "1". If the asset 110 is not taken out of service or when the TOS flag is set to "1", the method proceeds to 450 where a determination is made as to whether the data collection interval for the asset 110 has elapsed. If the data collection interval has not elapsed, the method continues to 420 for continued monitoring and acquisition of asset characteristic data for the asset 110.

At 455, if the data collection interval has elapsed, the collected data for the asset 110 is transmitted to the remote computer 160. The collected data may include, for example, an asset identification number, query parameters, asset characteristic statistics, the value of the REPAIR flag, and the value of the TOS flag. The remote computer 160 then, at 460, calculates asset health assessment factors, relative to the population of same or similar assets as provided in the database 170. The calculated health assessment factors may include, but are not limited to, risk factors (as a percentile ranking), time-to-failure probabilities, and remaining-life probabilities (see FIG. 6 for more details related to the calculations). At 465, the database 170 is updated accordingly with the calculated health assessment factors and the repair/TOS flags.

At 470, the remote computer 160 sends the asset health assessment to the local computer 140 associated with the asset 110.

With continued reference to FIG. 4, after the collected data for the asset 110 is transmitted to the remote computer 160 (at 455), the method also proceeds to 475, at which point asset data registers in the local computer 140 are cleared. At 480, the data collection interval timer is reset. At 485 and 490, REPAIR and TOS flags, respectively, are reset to "0" if necessary. The method then continues to 420 for continued monitoring and acquisition of asset characteristic data for the asset 110.

Now turning to the flowchart 500 FIG. 5, at point "B" the method continues after 470 in the flowchart 400 of FIG. 4. At 505, the asset health assessment is received by the local computer 140 from the remote computer 160. Optionally, at 510, the asset health assessment is saved to memory associated with the local computer 140. The local computer 140 obtains the pre-established thresholds (e.g., risk factor thresholds (515), the time-to-failure probability thresholds (520), and the remaining-life probability thresholds (525)), and uses these thresholds to compare asset health factors to the thresholds (530). At 535, a determination is made as to whether any thresholds are exceeded. If no thresholds are exceeded, at 540, asset repair and replacement is deferred and the method continues to point "A" back to 420 of the flowchart 400 of FIG. 4 (i.e., monitoring and acquisition of asset characteristic data for the asset 110).

If the determination at 535 concludes that one or more thresholds are exceeded, at 545, asset repair is scheduled and performed, and at 550, the REPAIR flag is set to "1"; or at 555, asset replacement is scheduled and performed, and at 560, the TOS flag is set to "1". The method then goes back to "A" of FIG. 4, for continued monitoring and acquisition of asset characteristic data for the asset 110.

Figure 6:
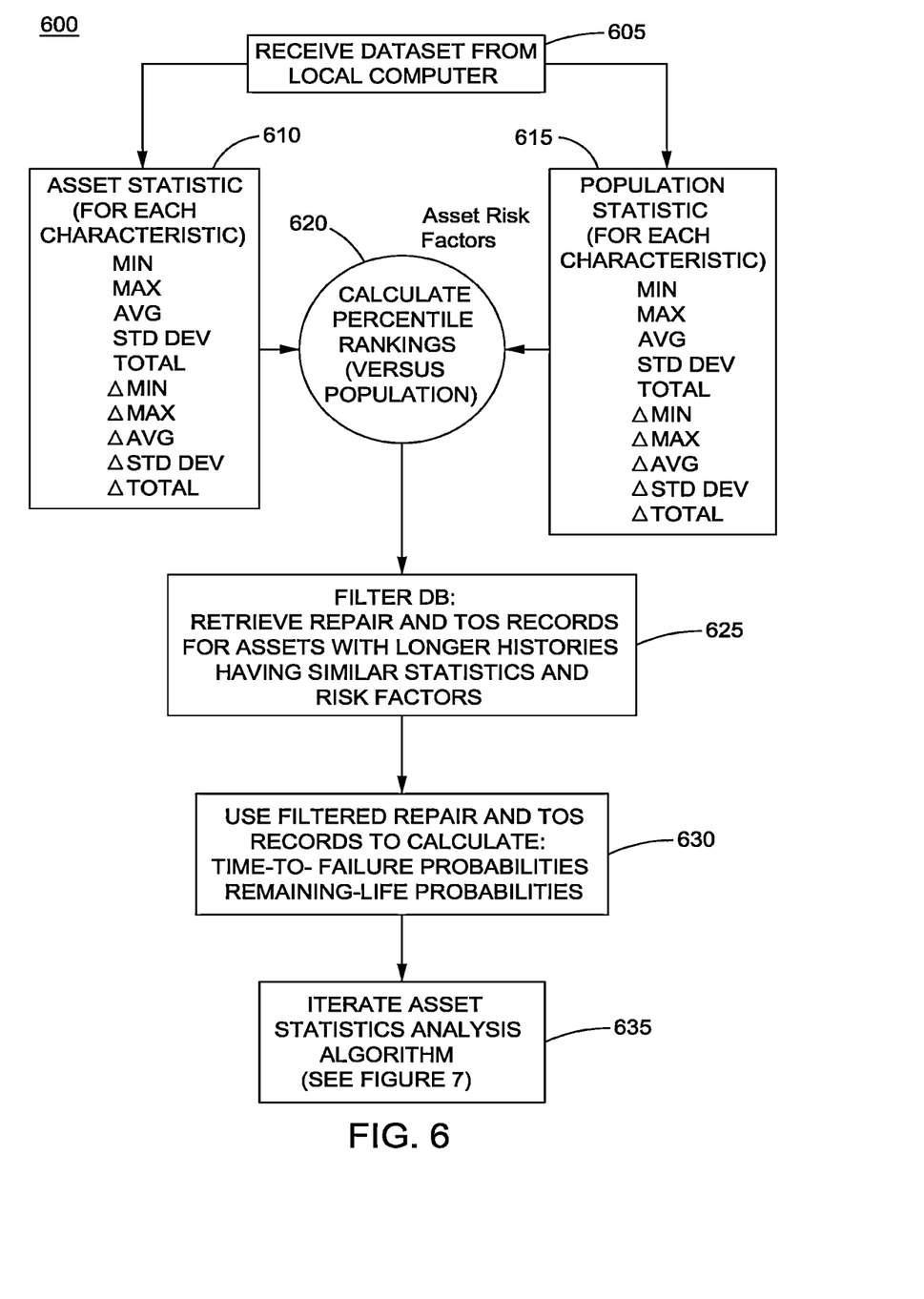
FIG. 6 is a subroutine, according to an embodiment, showing steps performed by a remote computer in calculating risk factors and predicting time-to-failure and remaining-life of a given asset within an electrical power system.

FIG. 6 is a subroutine 600, according to an embodiment, showing steps performed by the remote computer 160 in calculating risk factors and predicting time-to-failure and remaining-life of a given asset 110 within an electrical power system. At 605, the remote computer 160 receives the dataset from the local computer 140. In an embodiment, the dataset may include, for example, an asset identification number, query parameters, asset characteristic statistics, the value of the REPAIR flag, and the value of the TOS flag for the given asset 110 of interest.

At 620, the remote computer 160 calculates asset risk factors comprising percentile rankings (versus the population of similar and/or the same assets) using the asset statistic for each characteristic (e.g., minimum, maximum, average, change, etc.) (610) and the population statistic for each characteristic (615).

At 625, the remote computer 160 filters the database 170 to retrieve REPAIR and TOS records for a collection of assets. In an embodiment, the collection of assets comprise assets with longer histories having similar statistics and risk factors.

At 630, time-to-failure and remaining-life probabilities are calculated using the filtered REPAIR and TOS records. As noted above, in some embodiments, one of the calculations may be desired for a particular asset or asset type; while in other embodiments, both time-to-failure and remaining-life probabilities are desired.

Figure 7:
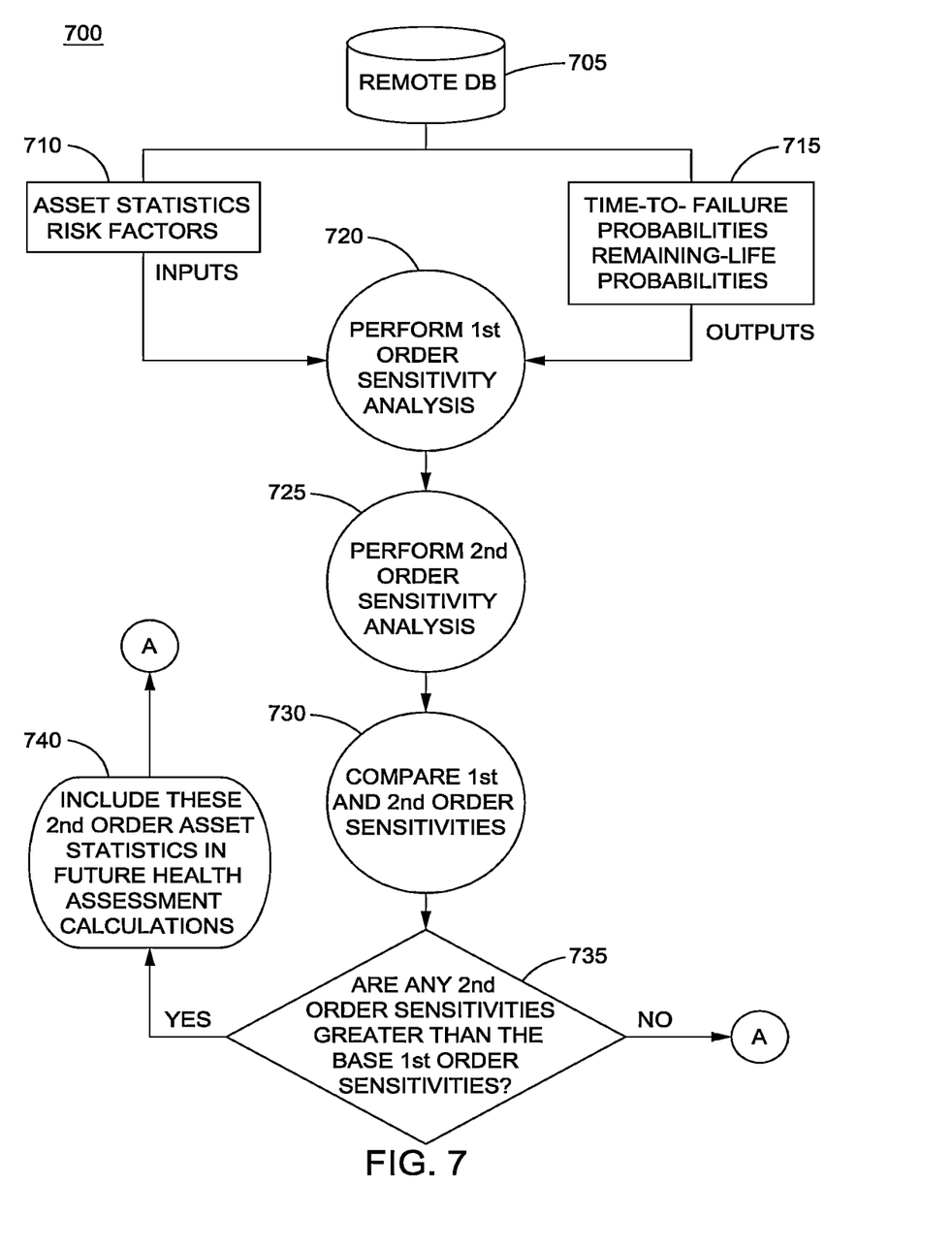
FIG. 7 is a subroutine, according to an embodiment, showing steps performed by a remote computing device in which the computing device learns for which asset characteristics (and combinations thereof) are the asset-related time-to-failure and remaining-life probability calculations most sensitive.

At 635, the asset statistics analysis algorithm is iterated (see FIG. 7).

FIG. 7 is a subroutine 700, according to an embodiment, showing steps performed by the remote computing device 160 in which the remote computing device 160 learns for which asset characteristics (and combinations thereof) are the asset-related time-to-failure and remaining-life probability calculations most sensitive.

At 705, the database 170 is accessed to obtain asset statistics risk factors (710) and time-to-failure probabilities and remaining-life probabilities (715). At 720, this data is used for a first-order sensitivity analysis, which is performed for each asset characteristic and risk factor. At 725, a second-order sensitivity analysis is performed. In an embodiment, the second-order sensitivity analysis uses combined effects of possible combinations of asset characteristic pairs.

At 730, the first-order and the second-order sensitivity analyses results are compared. At 735, a determination is made as to whether any second-order sensitivities are greater than the first-order sensitivities. If there are not any, the method resumes to "A" in the flowchart 400 of FIG. 4 for continued monitoring and acquisition of asset characteristic data for the asset 110.

If, however, the determination at 735 concludes that there are second-order sensitivities greater than first-order sensitivities, then at 740, these second-order asset statistics are included in future health assessment calculations. This result may be stored in the database 170, for example. The method then resumes to "A" in the flowchart 400 of FIG. 4 for continued monitoring and acquisition of asset characteristic data for the asset 110.

In other embodiments, third or higher-order sensitivity analyses may be included and performed. The use of three (or more) variables in calculating failure probabilities may result in an improved statistical confidence of the result.

Embodiments of the present system and method provide advantages over traditional asset health assessment systems and methods for at least the following reasons:

Traditional methods of assessing the health of an electrical power asset only include performance data collected on a given asset, without regard for or comparison to data collected from the same or similar assets. This is true for comparing performance of a given asset to published manufacturer's specifications or by trending performance of an asset over an extended time period. Such conventional methods do not leverage the benefits of data representative of a large population of units, which inherently would provide a higher level of statistical significance.

Traditional methods of assessing the health of an electrical power asset do not include asset repair and replacement information. Thus, important time-based correlation, in contrast to embodiments described herein, between representative asset performance and repair and replacement actions is not included in such analyses and assessments.

Traditional methods of assessing the health of an electrical power system asset do not include "operating" performance data with an asset's full performance history record. Including such "operating" performance (i.e., response to a given stimuli) as part of an asset's performance history results in improved statistical confidence in the results when performing asset health assessments as provided by embodiments described herein.

Traditional methods of assessing the health of an electrical power system asset are based on a relative ranking of an asset within a larger population of assets without regard to an asset's susceptibility of failure versus a predetermined threshold of tolerance for failure. Thus, a key disadvantage of such traditional health assessment methods is that repair and replacement activities are many times carried out on assets which may be performing within acceptable performance levels and which may have little probability of failing before the next health assessment is carried out.

Traditional methods of assessing the health of an electrical power system asset are only capable of assessing the health of one type of asset and lack any mechanism or mechanisms to differentiate and/or compare the health of assets between asset types when performing health assessments. This is a key disadvantage as compared to embodiments described herein, since a typical electrical power system contains a plurality of asset types and maintainers of such systems have limited budgets and resources. Knowing which asset, regardless of type, is most likely to fail next is critical in being able to most efficiently utilize limited resources and in minimizing the frequency of asset failures within the electrical power system.

Traditional methods of assessing the health of an electrical power system asset rely on characterizing asset performance without regard to specific "time intervals" as associated with such performance. This is a key disadvantage as compared to embodiments described herein, since assets within an electrical power system are typically subjected to very specific "time-interval" dependent external conditions, many of which affect asset performance. Thus, taking such time intervals into account, when employing such an asset health assessment system as provided by embodiments herein, provides for improved statistical confidence levels as compared to health assessment systems which do not take "time intervals" into account when performing statistical calculations. Typical time-interval dependent external conditions, within electrical power systems, include the four seasons (this is because electricity use, and thus stress on assets, is highest in the summer and winter months as compared to the spring and fall months) and thus, evaluating historical performance using time-intervals based on months allows for differentiation between seasons. Similarly, evaluating historical performance based on days allows for statistical differentiation between weekdays and weekends (in which electricity usage and thus stress on assets is different). And, evaluating historical performance based on hours allows for statistical differentiation between day and night (in which electricity usage and thus stress on assets is very different).

Traditional methods of assessing the health of an electrical power asset do not include machine-learning techniques and thus are not capable (without change or manual intervention) of increasing the statistical confidence in the outputted results, after any one or a multiple of repetitive process cycles.

Embodiments of the present invention provide commercial value because the electrical power industry is faced with an aging electrical system that is failing at unprecedented rates. Much of the existing infrastructure was installed decades ago and is operating well beyond its intended design life and is in critical need of repair or replacement. Utility companies are continually seeking better ways to prioritize the work required of their repair and maintenance groups and having better insight into when each of their assets is most likely to fail would allow them to significantly improve the planning and utilization of resources and increase the chances of reducing, preventing and/or avoiding power outages.

Providing utility companies with a system and method whereby they are able to compare the performance of a given asset against the performance of a large population of similar assets and to extract time-based correlations to representative repair and replacement histories provides the means to significantly improve the statistical confidence levels of asset health assessments.

Further providing, according to some embodiments disclosed herein, a technique whereby the computer product is programed to learn and adapt its asset analysis algorithm to increase (for future iterations of the algorithm) the statistical confidence levels of the time-to-failure and/or remaining-life probability calculations thereby, with each subsequent use of the system, further improves the planning and utilization of resources and increases the chances of reducing, preventing, and/or avoiding power outages.

Embodiments disclosed herein may be used by any network comprised of a plurality of sensors. For example, embodiments may be utilized with a data sensing platform, such as that disclosed in PCT Patent Application No. PCT/US15/21593, filed on Mar. 19, 2015 and entitled "Test Switch Signal Analyzer," the contents of which are hereby incorporated by reference in their entirety herein. Although embodiments of the invention described herein may be used by any network of common sensors, its value/benefit to industry may be significantly increased as the size of the reference database increases. PCT Patent Application No. PCT/US15/21593 describes one opportunity for generating a large reference database, as it provides an extremely simple, non-intrusive, and low-cost installation of a common data sensing platform and would thus provide a commercially viable way to create a very large population of data; perhaps larger than any existing population of data. It is noted that while the test switch signal analyzer described in PCT Patent Application No. PCT/US15/21593 is one viable option for the collection and storage of reference data, embodiments of the present invention do not necessarily have to be limited to the sensing platform described in PCT Patent Application No. PCT/US15/21593.

Figure 8:
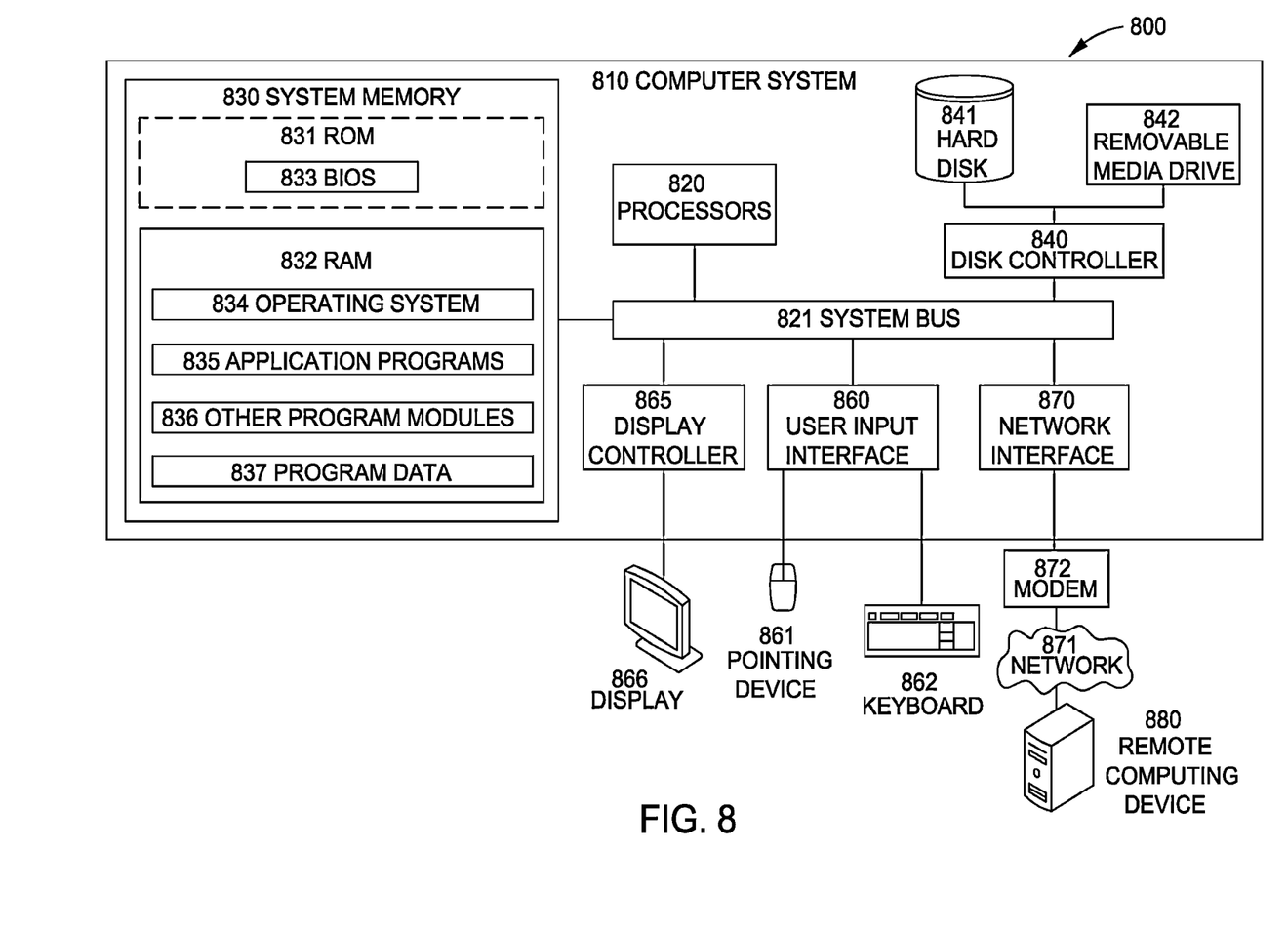
FIG. 8 illustrates an exemplary computing environment within which embodiments of the invention may be implemented.

FIG. 8 illustrates an exemplary computing environment 800 within which embodiments of the invention may be implemented. Computing environment 800 may include computer system 810, which is one example of a general purpose computing system upon which embodiments of the invention may be implemented. Computers and computing environments, such as computer 810 and computing environment 800, are known to those of skill in the art and thus are described briefly here.

As shown in FIG. 8, the computer system 810 may include a communication mechanism such as a bus 821 or other communication mechanism for communicating information within the computer system 810. The system 810 further includes one or more processors 820 coupled with the bus 821 for processing the information. The processors 820 may include one or more central processing units (CPUs), graphical processing units (GPUs), or any other processor known in the art.

The computer system 810 also includes a system memory 830 coupled to the bus 821 for storing information and instructions to be executed by processors 820. The system memory 830 may include computer readable storage media in the form of volatile and/or nonvolatile memory, such as read only memory (ROM) 831 and/or random access memory (RAM) 832. The system memory RAM 832 may include other dynamic storage device(s) (e.g., dynamic RAM, static RAM, and synchronous DRAM). The system memory ROM 831 may include other static storage device(s) (e.g., programmable ROM, erasable PROM, and electrically erasable PROM). In addition, the system memory 830 may be used for storing temporary variables or other intermediate information during the execution of instructions by the processors 820. A basic input/output system (BIOS) 833 containing the basic routines that help to transfer information between elements within computer system 810, such as during start-up, may be stored in ROM 831. RAM 832 may contain data and/or program modules that are immediately accessible to and/or presently being operated on by the processors 820. System memory 830 may additionally include, for example, operating system 834, application programs 835, other program modules 836, and program data 837.

The computer system 810 also includes a disk controller 840 coupled to the bus 821 to control one or more storage devices for storing information and instructions, such as a magnetic hard disk 841 and a removable media drive 842 (e.g., floppy disk drive, compact disc drive, tape drive, and/or solid state drive). The storage devices may be added to the computer system 810 using an appropriate device interface (e.g., a small computer system interface (SCSI), integrated device electronics (IDE), Universal Serial Bus (USB), or FireWire).

The computer system 810 may also include a display controller 865 coupled to the bus 821 to control a display or monitor 866, such as a cathode ray tube (CRT) or liquid crystal display (LCD), for displaying information to a computer user. The computer system 810 includes an input interface 860 and one or more input devices, such as a keyboard 862 and a pointing device 861, for interacting with a computer user and providing information to the processors 820. The pointing device 861, for example, may be a mouse, a trackball, or a pointing stick for communicating direction information and command selections to the processors 820 and for controlling cursor movement on the display 866. The display 866 may provide a touch screen interface which allows input to supplement or replace the communication of direction information and command selections by the pointing device 861.

The computer system 810 may perform a portion or all of the processing steps of embodiments of the invention in response to the processors 820 executing one or more sequences of one or more instructions contained in a memory, such as the system memory 830. Such instructions may be read into the system memory 830 from another computer readable medium, such as a hard disk 841 or a removable media drive 842. The hard disk 841 may contain one or more data-stores and data files used by embodiments of the present invention. Data-store contents and data files may be encrypted to improve security. The processors 820 may also be employed in a multi-processing arrangement to execute the one or more sequences of instructions contained in system memory 830. In alternative embodiments, hard-wired circuitry may be used in place of or in combination with software instructions. Thus, embodiments are not limited to any specific combination of hardware circuitry and software.

As stated above, the computer system 810 may include at least one computer readable medium or memory for holding instructions programmed according embodiments of the invention and for containing data structures, tables, records, or other data described herein. The term "computer readable medium" as used herein refers to any medium that participates in providing instructions to the processors 820 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 841 or removable media drive 842. Non-limiting examples of volatile media include dynamic memory, such as system memory 830. Non-limiting examples of transmission media include coaxial cables, copper wire, and fiber optics, including the wires that make up the bus 821. Transmission media may also take the form of acoustic or light waves, such as those generated during radio wave and infrared data communications.

The computing environment 800 may further include the computer system 810 operating in a networked environment using logical connections to one or more remote computers, such as remote computer 880. Remote computer 880 may be a personal computer (laptop or desktop), a mobile device, a server, a router, a network PC, a peer device or other common network node, and typically includes many or all of the elements described above relative to computer system 810. When used in a networking environment, computer system 810 may include modem 872 for establishing communications over a network 871, such as the Internet. Modem 872 may be connected to system bus 821 via user network interface 870, or via another appropriate mechanism.

Network 871 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 810 and other computers (e.g., remote computing system 880). The network 871 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 871.

As described herein, the various systems, subsystems, agents, managers and processes can be implemented using hardware components, software components, and/or combinations thereof.

Although the present invention has been described with reference to exemplary embodiments, it is not limited thereto. Those skilled in the art will appreciate that numerous changes and modifications may be made to the preferred embodiments of the invention and that such changes and modifications may be made without departing from the true spirit of the invention. It is therefore intended that the appended claims be construed to cover all such equivalent variations as fall within the true spirit and scope of the invention.

We claim:

1. A method for performing an asset health assessment for an asset operating within an electrical power system, the method comprising:
   acquiring, by a computing device in communication with the electrical power system, data representing operating characteristics of the asset over a data collection interval;
   associating, by the computing device, the asset with a plurality of similar assets having data stored within a database accessible by the computing device, the plurality of similar assets containing similar historical operating characteristics to the operating characteristics of the asset;
   correlating, by the computing device, the similar historical operating characteristics of the plurality of similar assets within the database with repair and replacement activity for the plurality of similar assets; and
   based on the correlation, predicting, by the computing device, one or more of a most likely time-to-failure of the asset and a most likely remaining-life of the asset.

2. The method of claim 1, further comprising outputting, by the computing device, the predictions to a local computer associated with the asset to perform one or more corrective actions for the asset.

3. The method of claim 2, further comprising comparing, by the local computer, the one or more of the most likely time-to-failure of the asset and the most likely remaining-life of the asset to pre-established threshold values to determine the one or more corrective actions for the asset.

4. The method of claim 1, wherein the acquisition by the computing device of the data representing operating characteristics of the asset is by transmission of the data from a local computer associated with the asset, the local computer connected via a network to the computing device.

5. The method of claim 4, wherein the local computer associated with the asset receives asset characteristic data from a monitoring device coupled to the asset; and
   wherein the local computer calculates the data representing the operating characteristics of the asset based on the received asset characteristic data.

6. The method of claim 1, wherein the data representing operating characteristics of the asset comprises statistics relating to one or more of performance characteristics, environmental characteristics, and usage characteristics of the asset.

7. The method of claim 1, further comprising calculating, by the computing device, percentile rankings based on the operating characteristics of the asset and the similar historical operating characteristics of the asset.

8. The method of claim 1, wherein predicting one or more of the most likely time-to-failure of the asset and the most likely remaining-life of the asset comprises:
   calculating a set of probabilities associated with one or more of next repair of the asset and next replacement of the asset, for various points in time, for a given operating characteristic of the operating characteristics of the asset.

9. The method of claim 1, further comprising establishing the database by:
- acquiring, by the computing device, data representing at least one operating characteristic of a particular asset within the electrical power system at specific points in time;
- acquiring, by the computing device, data indicating when repair and replacement activity is conducted for the particular asset within the electrical power system; and
- populating, by the computing device, the database with time-identified operating characteristics and repair and replacement activity for the particular asset within the electrical power system.

10. The method of claim 1, further comprising:
- acquiring, by the computing device, one or more flag settings relating to one or more of repair of the asset and replacement of the asset; and
- associating, by the computing device, the one or more flag settings with the asset in the database.

11. The method of claim 1, further comprising performing, by the computing device, sensitivity analysis comprising:
- performing a first-order sensitivity analysis for each operating characteristic of the asset based on asset risk factors and the one or more of the most likely time-to-failure of the asset and the most likely remaining-life of the asset;
- performing a second-order sensitivity analysis using combined effects of possible combinations of pairs of the operating characteristics of the asset;
- comparing results of the first-order and the second-order sensitivity analyses; and
- if any second-order sensitivities are greater than the first-order sensitivities, updating the database with second-order asset statistics to be associated with the asset.

12. A power system asset health assessment system, the system comprising:
- a plurality of monitoring systems connected via a common network, each monitoring system configured to monitor a respective asset of a plurality of assets in an electrical power system;
- a computing device in communication with the plurality of monitoring systems via the common network, the computing device configured to:
- acquire data representing operating characteristics of a given asset over a data collection interval from a respective one of the plurality of monitoring systems;
- associate the given asset with a plurality of similar assets having data stored within a database accessible by the computing device, the plurality of similar assets containing similar historical operating characteristics to the operating characteristics of the given asset;
- correlate the similar historical operating characteristics of the plurality of similar assets within the database with repair and replacement activity for the plurality of similar assets; and
- based on the correlation, predict one or more of a most likely time-to-failure of the given asset and a most likely remaining-life of the given asset.

13. The system of claim 12, wherein the computing device is further configured to output the predictions to a local computer of the respective one of the plurality of monitoring systems to perform one or more corrective actions for the given asset.

14. The system of claim 13, wherein the local computer compares the one or more of the most likely time-to-failure of the given asset and the most likely remaining-life of the given asset to pre-established threshold values to determine the one or more corrective actions for the given asset.

15. The system of claim 14, wherein the plurality of monitoring systems further comprise a monitoring device coupled to the respective asset of the plurality of assets in the electrical power system, each monitoring device configured to transmit asset characteristic data to a respective local computer;
- wherein the local computer calculates the data representing the operating characteristics of the given asset based on the received asset characteristic data.

16. The system of claim 12, wherein the data representing operating characteristics of the given asset comprises statistics relating to one or more of performance characteristics, environmental characteristics, and usage characteristics of the given asset.

17. The system of claim 12, wherein the computing device is further configured to calculate percentile rankings based on the operating characteristics of the given asset and the similar historical operating characteristics of the given asset.

18. The system of claim 12, wherein the computing device predicts one or more of the most likely time-to-failure of the given asset and the most likely remaining-life of the given asset by:
- calculating a set of probabilities associated with one or more of next repair of the given asset and next replacement of the given asset, for various points in time, for a given operating characteristic of the operating characteristics of the given asset.

19. The system of claim 12, wherein the computing device is further configured to:
- acquire one or more flag settings relating to one or more of repair of the given asset and replacement of the given asset; and
- associate the one or more flag settings with the given asset in the database.

20. The system of claim 12, wherein the computing device is further configured to perform sensitivity analysis comprising:
- performing a first-order sensitivity analysis for each operating characteristic of the given asset based on asset risk factors and the one or more of the most likely time-to-failure of the given asset and the most likely remaining-life of the given asset;
- performing a second-order sensitivity analysis using combined effects of possible combinations of pairs of the operating characteristics of the given asset;
- comparing results of the first-order and the second-order sensitivity analyses; and
- if any second-order sensitivities are greater than the first-order sensitivities, updating the database with second-order asset statistics to be associated with the given asset.

* * * * *